(12) United States Patent
McCullough et al.

(10) Patent No.: US 6,547,001 B2
(45) Date of Patent: Apr. 15, 2003

(54) FLEXIBLE GLOVE-LIKE HEAT SINK

(75) Inventors: Kevin A. McCullough, Warwick, RI (US); E. Mikhail Sagal, Watertown, MA (US); James D. Miller, Marietta, GA (US)

(73) Assignee: Cool Shield, Inc., Warwick, RI (US)

( * ) Notice: Subject to any disclaimer, the term of this patent is extended or adjusted under 35 U.S.C. 154(b) by 0 days.

(21) Appl. No.: 10/064,069

(22) Filed: Jun. 6, 2002

(65) Prior Publication Data

US 2002/0185270 A1 Dec. 12, 2002

Related U.S. Application Data

(60) Provisional application No. 60/296,871, filed on Jun. 8, 2001.

(51) Int. Cl.[7] .................................................. F28F 7/00
(52) U.S. Cl. ...................... 165/185; 165/80.3; 165/46; 361/704; 361/727; 361/714; 174/16.3; 257/712
(58) Field of Search ..................... 165/80.3, 46, 185; 361/704, 707, 727, 726, 714, 710; 174/16.3; 257/712, 722

(56) References Cited

U.S. PATENT DOCUMENTS

| | | | |
|---|---|---|---|
| 4,900,877 A | 2/1990 | Dubrow et al. | |
| 4,938,279 A | 7/1990 | Betker | |
| 4,948,922 A | 8/1990 | Varadan et al. | |
| 4,999,741 A | 3/1991 | Tyler | |
| 5,061,566 A | 10/1991 | Morgan | |
| 5,115,104 A | 5/1992 | Bunyan | |
| 5,187,225 A | 2/1993 | Kitagawa | |
| 5,299,632 A * | 4/1994 | Lee ............................ 165/80.3 | |
| 5,315,480 A | 5/1994 | Samarov et al. | |
| 5,430,609 A | 7/1995 | Kikinis | |
| 5,440,172 A | 8/1995 | Sutrina | |
| 5,446,617 A * | 8/1995 | Blocher et al. ............. 361/674 |
| 5,513,070 A | 4/1996 | Xie et al. | |
| 5,521,792 A * | 5/1996 | Pleitz et al. ................. 361/715 |
| 5,552,960 A | 9/1996 | Nelson et al. | |
| 5,557,500 A | 9/1996 | Baucom et al. | |
| 5,572,070 A | 11/1996 | Ross | |
| 5,660,917 A | 8/1997 | Fujimori et al. | |
| 5,738,936 A | 4/1998 | Hanrahan | |
| 5,742,478 A * | 4/1998 | Wu .............................. 361/704 |
| 5,781,412 A | 7/1998 | de Sorgo | |
| 5,790,376 A | 8/1998 | Moore | |
| 5,910,524 A | 6/1999 | Kalinoski | |
| 6,046,908 A * | 4/2000 | Feng ........................... 361/707 |
| 6,093,961 A * | 7/2000 | McCullough ............... 257/718 |
| 6,204,303 B1 | 3/2001 | Osuna et al. | |
| 6,348,654 B1 | 2/2002 | Zhang et al. | |
| 6,373,701 B1 * | 4/2002 | Lo .............................. 361/704 |
| 6,410,137 B1 | 6/2002 | Bunyan | |
| 6,411,514 B1 * | 6/2002 | Hussaini ..................... 361/704 |

* cited by examiner

Primary Examiner—Henry Bennett
Assistant Examiner—Terrell McKinnon
(74) Attorney, Agent, or Firm—Barlow, Josephs & Holmes, Ltd.

(57) ABSTRACT

A heat sink assembly for removing heat from an object having an outer surface includes a main body with an object receiving seat. A pair of flexible securing tabs are connected to the free edge of the open end of the main body which emanate into the open end of the main body. A heat dissipation members emanate from the outer surface of the main body to assist in dissipating the heat received by the main body from the heat generating object. The main body, the pair of flexible securing tabs and heat dissipating members are integrally formed with one another of a thermally conductive elastic or elastomeric material. An object to be cooled is inserted into the object receiving seat of the main body and retained in the seat and in communication with the inner surfaces of the main body by the pair of flexible securing tabs.

11 Claims, 4 Drawing Sheets

FLEXIBLE GLOVE-LIKE HEAT SINK

CROSS REFERENCE TO RELATED APPLICATIONS

This application is related to and claims priority from earlier filed provisional patent application No. 60/296,871, filed Jun. 8, 2001.

BACKGROUND OF INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the microprocessors discussed above, there are many other types of semiconductor device packages which are commonly used in computer equipment, for example. For example, resistors and thermistors generate large volumes of heat during normal operation and are also subject to failure if not cooled properly.

Also, the solid state devices are commonly being installed onto a circuit board which is, in turn, installed into a motherboard or other similar primary circuit board. For example, microprocessors, such as the Pentium II and the Celeron from Intel, are "processor cards" which are installed into a motherboard of a computer in similar fashion to the way a modem is installed into a motherboard. On a given processor card is typically the processor semiconductor device package itself along with any other chips or semiconductor devices that are necessary for the operation of the card, such cache chips, or the like. The processor package may be installed into the processor card via a pin grid, ball grid, land grid array and with a socket such as a ZIF or ball grid socket.

In similar fashion to the earlier semiconductor devices discussed above, many different types of electronic devices suffer from overheating. For example, any electronic device package may have a threat of overheating. However, there are many types of electronic devices that need cooling; however, the devices are too small to adequately support and receive the typical metallic heat sink. These prior metallic heat sinks are commonly glued directly to the electronic device with a thermally conductive adhesive, or plant to the electronic device package with a mechanical structure, such as a spring clip. Further, gap pads are often required to even out the interface surface to achieve satisfactory thermal conductivity. In view of the foregoing issues related to these types of electronic components, providing heat dissipation in the form of heat sinks, and the like, are difficult and cost prohibitive.

The foregoing heat sink assemblies of the prior art suffer from the disadvantages of having multiple components and the high cost associated therewith. These multiple component heat sink assemblies typically include expensive machined or extruded heat conductive metal, such as aluminum. Other parts, such as springs or addition clips require separate machining steps and/or molds for production. Therefore, these assemblies and methods are completely inappropriate for most electronic devices.

In view the foregoing, there is a demand for a heat sink assembly that obviates the need for thermal adhesives, interface pads, mechanical connection devices as well as the need for expensive machined heat sinks. There is also a demand for a heat sink assembly that can be easily provided onto an electronic device for cooling either when the electronic device is already installed on its circuit board, on a reel fed strip of devices for installation by automatic machinery or still loose as an individual component. There is also a demand for a heat sink assembly that can provide a superior interface between the electronic device to be cooled and the heat dissipating material itself. There is a demand for a heat sink assembly that can be installed without special tools and without the need for adhesives or interface materials. There is also a demand for such a heat sink assembly to be easily removable, if desired.

SUMMARY OF INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique net-shaped formed heat sink assembly and method of manufacturing a heat sink assembly with particular application in cooling microprocessor integrated circuit devices, such as an electronic device package. The heat sink assembly and method of the present invention enables the cost-effective cooling of electronic devices while realizing superior thermal conductivity.

In accordance with the present invention, the heat sink assembly has an outer surface that includes a main body with an object receiving seat. A pair of flexible securing tabs are connected to the free edge of the open end of the main body which emanate into the open end of the main body. A heat dissipation members emanate from the outer surface of the main body to assist in dissipating the heat received by the main body from the heat generating object. The main body, the pair of flexible securing tabs and heat dissipating members are integrally formed with one another of a thermally conductive elastomeric material. An object to be cooled is inserted into the object receiving seat of the main body and retained in the seat and in communication with the inner surfaces of the main body by the pair of flexible securing tabs.

In the method of manufacture of the present invention, a main body of thermally conductive elastomeric material with an object receiving seat is provided having an inner surface and an open end with a free edge. A number of heat dissipation members are provided on the outer surface of the main body which are integrally connected to the main body. At least one flexible securing tab, preferably a pair, of thermally conductive elastomeric material is provided at the free edge of the main body and emanating into the open end of the main body. The object to be cooled is inserted into the seat of main body while the flexible securing tabs are partially bent to permit the object to be cooled to pass thereby. Once the object is fully residing in the seat and clear of the securing tabs, the tabs flex back into place to partially block the open end the seat to prevent unwanted removal of the object from the seat. Thus, the outer heat generating surface of the object to be cooled is placed into thermal communication with the inner surface of the object receiving seat to provide an effective heat sink assembly for cooling the heat generating object to ensure proper operation thereof.

It is therefore an object of the present invention to provide a heat sink assembly that is net-shaped formed with flexible material to installation onto a heat generating object, such as an electronic device.

It is an object of the present invention to provide a complete heat sink assembly that encompasses a heat generating electronic device without the need for thermally conductive adhesives.

It is a further object of the present invention to provide a complete heat sink assembly that does not require gap pads, interface materials or other mechanical structures for retaining the heat sink assembly in communication with the heat generating electronic device.

Another object of the present invention is to provide a heat sink assembly that can be installed on a series of reel-fed electronic devices for later automatic installation into a circuit board or onto the electronic device already installed on its corresponding circuit board.

It is a further object of the present invention to provide a heat sink assembly that can be easily attached to a heat generating electronic device without disturbing the device itself while, simultaneously, providing superior heat dissipation therefrom.

It is another object to provide a heat sink assembly that can be easily removed from the object to be cooled.

DETAILED DESCRIPTION

Figure 1:
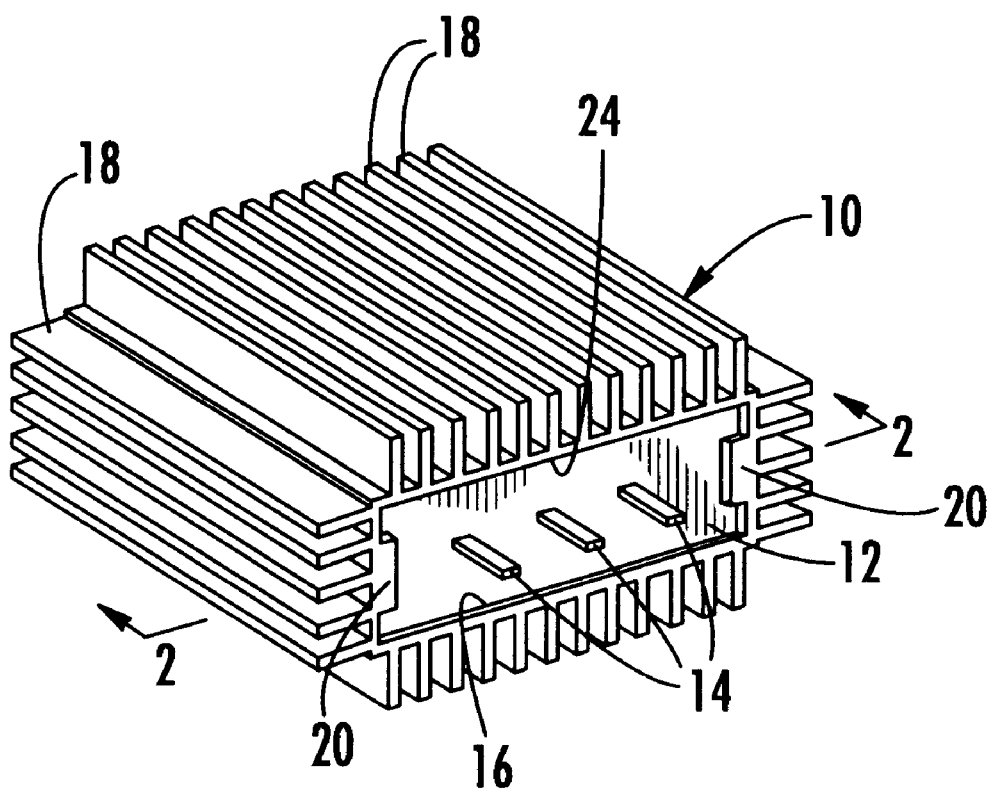
FIG. 1 is an perspective view of the heat sink assembly of the present invention installed on an electronic device.

The present invention provides a heat sink assembly 10 for attachment to a wide range of types of objects 12 to be cooled, such as electronic devices having electrical interconnection pins 14. These packages 12 may or may not be attached to a circuit board such as a motherboard or daughter card (not shown). The present invention is shown in the Figures as attaching to a rectangular electronic device 12 with pins 14, such as a resistor or thermistor. This example is for illustration purposes only. It should be understood that various other types of semiconductor packages and objects to be cooled may accommodate the heat sink assembly of the present invention. For example, the present invention may accommodate ball grid array (BGA) packages as well as land grid array (LGA) packages as well as non-electronic objects such as heat pipes, heaters, and the like.

Figure 2:
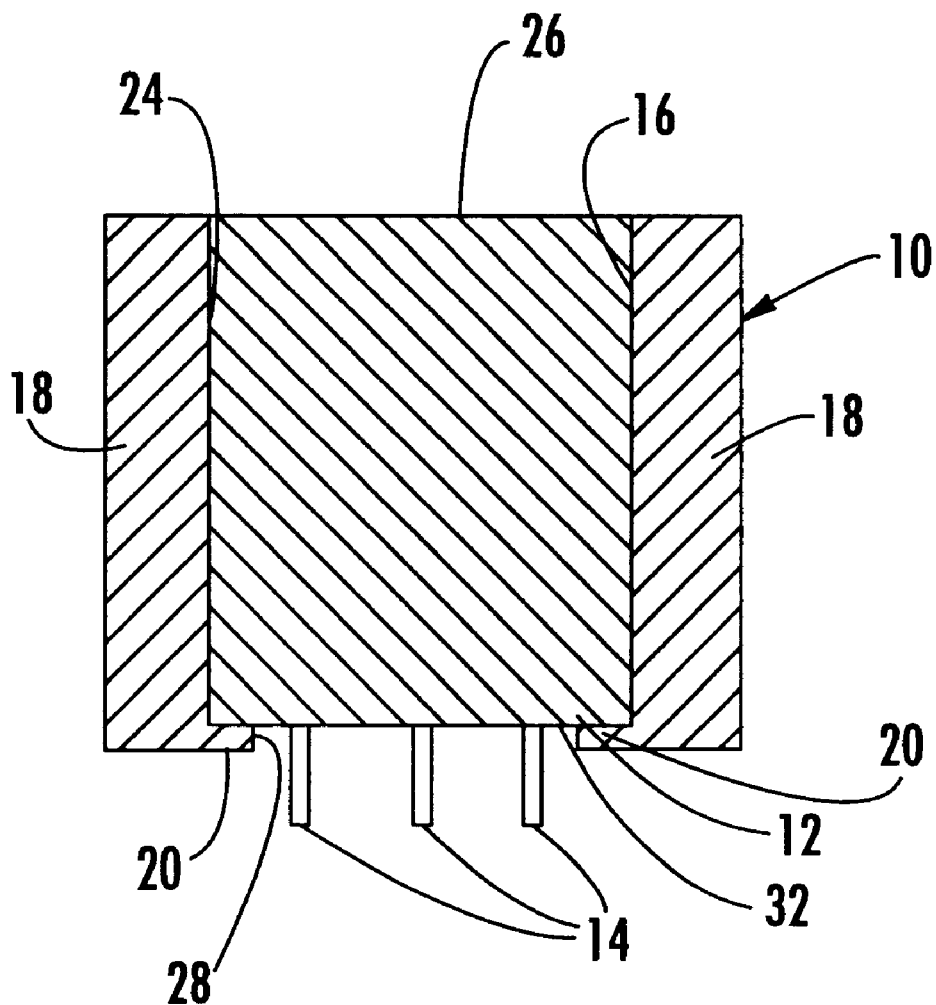
FIG. 2 is a cross-sectional view through the line 2—2 of FIG. 1.
Figure 4:
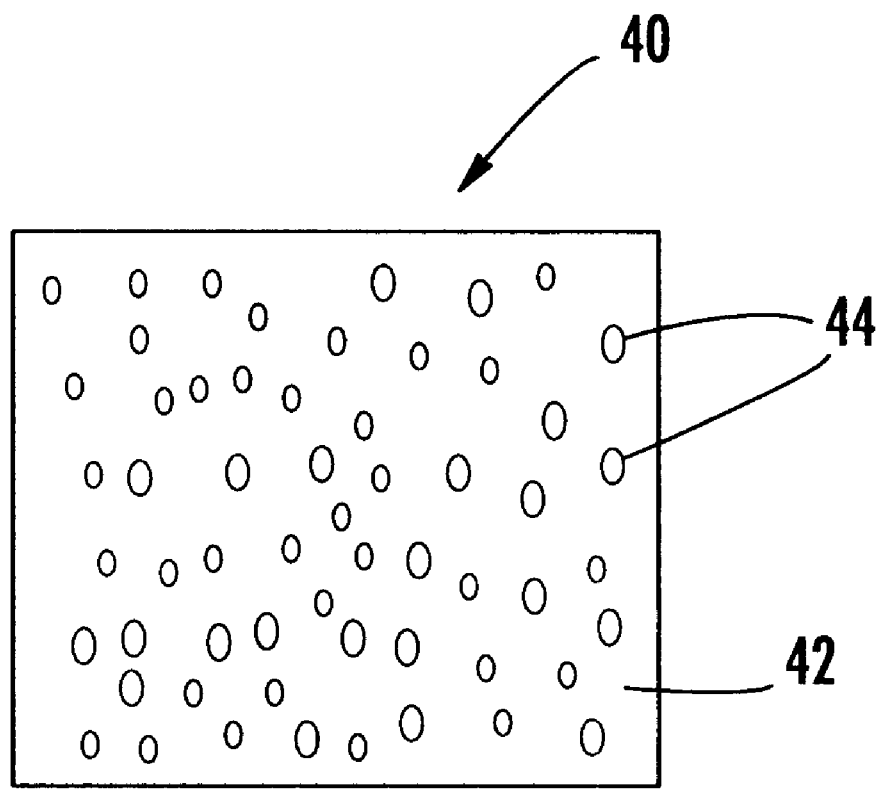
FIG. 4 is a cross-sectional view of the material for forming the heat sink assembly of the present invention.

Referring first to FIGS. 1 and 2, the heat sink assembly 10 of the present invention is shown installed over an electronic device package 12 with a series of leads or pins 14 emanating outwardly therefrom. The heat sink assembly 10 is formed of a flexible moldable material, such as a thermally conductive elastomeric composition. For example, this composition is preferably a thermoplastic elastic or thermoplastic elastomer with thermally conductive filler therein. As shown in FIG. 4, working material 40 includes a base material 42 that is flexible to enable the heat sink assembly 10 to flex around the object 12 to be cooled. The base material 42 may be thermoplastic elastic olefin, thermoplastic elastomer, thermoplastic elastomer—olefinic, thermoplastic elastomer—styrenic or thermoplastic urethane. This base material 42 is preferably loaded with a thermally conductive filler 44 such as alumina, carbon fiber, boron nitride and metallic flakes. Depending on the application at hand, certain base materials 42 and fillers 44 may be desired to achieve the desired properties. For example, a flame retardant filler may be included in the composition if such a property is desired.

Below is the composition of the preferred material for use in connection with the manufacture of the heat sink assembly 10 of the present invention.

In an example of the heat sink assembly of the present invention, the heat sink assembly of a configuration as shown in FIG. 1 is provided where a thermoplastic elastomer—styrenic base is provided in the volume amount of 50% and boron nitride filler in the amount of 50% filler. In this example, a dielectric insulative filler is employed because an electronic device is receiving the heat sink assembly 10 of the present invention.

In accordance with the present invention, it is preferred that the following ranges of components be employed to achieve a heat sink assembly 10 that is both flexible enough for installation onto a electronic device 12 but has a thermal conductivity that is suitable for effectively removing heat therefrom.

The base material 42 may be provided in the volume range of 10% to 90% while the filler, similarly, may be provided in the volume range of 10% to 90% filler. Further, the thermal conductivity of the heat sink assembly, when completed, is at least 1.0 W/m ° K. but may reach 20 W/m ° K. or even higher. The amount of loading of the composition 40 is dictating by the filler used, the desired properties of the composition for the particular application at hand.

As seen in the Figures, the thermally conductive composition is formed, such as by injection molding, into a unitary heat sink assembly, generally shown as 12, with a object receiving seat 16 formed therein. Additional heat dissipating members 18 are provided to further enhance the thermal conductivity of the heat sink assembly 10 of the present invention. Also provided are a number of object securing tabs 20 which emanate inwardly from the outer edge of the seat 16. Preferably, a pair of securing tabs 20 are provided on opposing sides of the edge of the seat 16. Additional securing tabs 20 may be employed as needed by the particular application at hand. The heat sink assembly 10, including the heat dissipating members 18 and securing tabs 20 are preferably integrally formed with one another from the same composition and from a single injection mold. Thus, the entire heat sink assembly 12 is net-shape moldable which means that no additional formation, such as machining and the like, is required before use of the heat sink assembly 10. However, other methods of formation of the heat sink assembly 10 may be employed and still be within the scope of the present invention.

In accordance with the present invention, the heat sink assembly 10 snugly fits over the electronic device 12 to be cooled to ensure a quality thermal interface therebetween to obviate the need for thermal greases and other thermal interfaces.

Preferably, the heat sink assembly 10 substantially embraces the electronic device 12 on as many sides is possible. As can be seen in the figures, the heat sink assembly 10 is configured so when installed it does not interfere with and of the critical leads 14 emanating from the electronic device 12. In the embodiment shown in FIG. 1 and FIG. 2, it is only necessary for the heat sink assembly 10 to be embrace the sides and top surfaces of the electronic device 12. However, depending on the application, other configurations of the heat sink assembly 10 can be carried out.

As also seen in FIG. 1 and FIG. 2, For example, the heat dissipating members 18 are shown to be a fin array for this particular application. It should be understood that these heat dissipating members 18 may be pins or other configurations to suit the application at hand. It should also be noted that the heat dissipating members 18 emanate outwardly from the sides of the heat sink assembly 10. Depending on application, thermally conductive material and desired heat dissipation, the configuration, location and direction of these heat dissipating members 18 can be varied.

Figure 3:
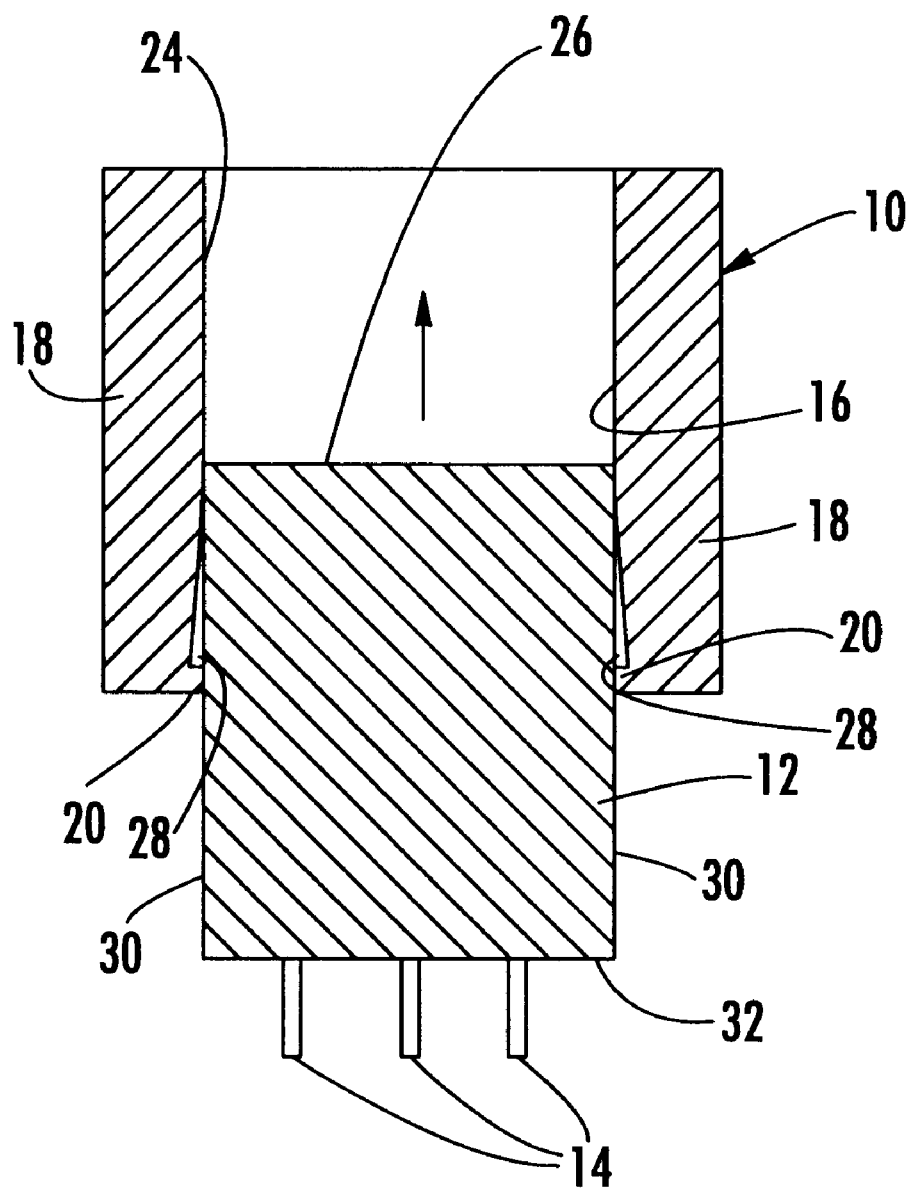
FIG. 3 cross-sectional view through the line 2—2 of FIG. 1 during the process of installing the heat sink assembly onto the electronic device to be cooled.

Referring now to FIG. 3, installation process of the heat sink assembly 10 onto the electronic device 12 is shown in detail. As stated above, this electronic device 12 is for illustration purposes only. In this particular electronic device 12, a main body 12 is provided with a number of electronic interconnection leads 14 emanating therefrom.

For installation, the leading edge 26 of the electronic device 12 is inserted into the open end 28 of the heat sink assembly 10. The periphery of the leading edge of the electronic device 12 causes the securing tabs 20 to flex upwardly and fold slightly and ride along the opposing sides 30 of the electronic device 12. Since the heat sink assembly 10 is manufactured of an elastic or elastomeric material, the entire body of the heat sink assembly 10 stretches outwardly to permit receipt of the electronic device therein in interference fit fashion. When the electronic device 12 has been inserted all of the way into its seat 16 in the heat sink assembly 10, the securing tabs 20 flex back down and outwardly to reside below and in communication with the bottom surface 32 of the electronic device 12. As a result, the electronic device 12 is secured within the heat sink assembly 10 by the securing tabs to avoid unwanted removal of the heat sink assembly 10 from the electronic device 12. However, if desired, the heat sink assembly 10 may be pulled off the electronic device against the forces of the securing tabs 20. However, during normal use of the electronic device 12, the heat sink assembly 10 would not separate from the electronic device 12.

It is preferred that the present invention be manufactured from a unitary molded member of a thermally conductive material with some type of flexible component to permit the desired stretching during installation to achieve a snug interference fit for optimal thermal communication between the heat sink assembly 10 and the outer surfaces of the heat generating electronic device package. Such unitary construction is unlike that found in the prior and provides significant advantages including low cost, ease of manufacture and flexibility of heat geometry due to the ability to mold the assembly as opposed to machining it. Fins are illustrated in a pin grid configuration but various other heat sink fin configurations, such as a radial fin array, may be employed.

It would be appreciated by those skilled in the art that various changes and modifications can be made to the illustrated embodiments without departing from the spirit of the present invention. All such modifications and changes are intended to be covered by the appended claims.

What is claimed is:

1. A heat sink assembly for removing heat from an object having an outer surface, comprising:
    a main body; the main body defining an object receiving seat having an inner surface, an outer surface and an open end with a free edge;
    at least one flexible securing tab connected to the free edge of the main body and emanating into the open end of the main body;
    a plurality of heat dissipation members emanating from the outer surface of the main body; the main body, the at least one flexible securing tab and plurality of heat dissipation members being manufactured of a thermally conductive elastic material; and
    whereby an object to be cooled is insertable into communication with the inner surface of the object receiving seat of the main body and retained in the object receiving seat and in communication with the floor and side walls of the main body by the at least one flexible object securing tab.

2. The heat sink assembly of claim 1, wherein the thermally conductive elastic material is an elastic base material loaded with a filler selected from the group consisting of: alumina, carbon fiber, boron nitride and metallic flakes.

3. The heat sink assembly of claim 2, wherein the elastic base material is selected from the group consisting of: thermoplastic elastic olefin, thermoplastic elastomer, thermoplastic elastomer—olefinic, thermoplastic elastomer—styrenic and thermoplastic urethane.

4. The heat sink assembly of claim 1, wherein the plurality of heat dissipation members are fins.

5. The heat sink assembly of claim 1, wherein the main body, the at least one securing tab and the plurality of heat dissipating members are integrally formed with one another.

6. The heat sink assembly of claim 1, wherein the at least one securing tab is a pair of securing tabs on opposite sides of the open end of the main body from one another.

7. A method of installing a heat sink assembly on an object to be cooled, comprising the steps of:
    providing a main body of thermally conductive elastic material with an object receiving seat having an inner surface and an open end with a free edge;
    providing a plurality of heat dissipation members from the outer surface of the main body and integrally connected thereto;
    providing at least one flexible securing tab of thermally conductive elastic material at the free edge of the main body and emanating into the open end of the main body;
    providing an object to be cooled having an outer heat generating surface;
    flexing the at least one flexible securing tab to clear the at least one flexible securing tab away from the open end of the main body;
    inserting the object to be cooled into the object receiving seat; and
    placing the outer heat generating surface of the object to be cooled into thermal communication with the inner surface of the object receiving seat.

8. A method of manufacturing a heat sink assembly, comprising the steps of:
    forming a main body of thermally conductive elastic material with an object receiving seat having an inner surface, an outer surface and an open end with a free edge;

forming a plurality of heat dissipation members from the outer surface of the main body and integrally connected thereto; and forming at least one flexible securing tab of thermally conductive elastic material at the free edge of the main body and emanating into the open end of the main body.

9. The method of claim 8, wherein the step of forming a main body is injection molding a main body.

10. The method of claim 8, wherein the step of forming a plurality of heat dissipating members is injection molding a plurality of heat dissipating members.

11. The method of claim 8, wherein the step of forming at least one flexible securing tab is injection molding at least one flexible object securing tab.

* * * * *